(12) United States Patent
Tachioka et al.

(10) Patent No.: US 12,733,494 B2
(45) Date of Patent: Sep. 8, 2026

(54) SEMICONDUCTOR ELEMENT BONDING PORTION AND SEMICONDUCTOR DEVICE

(71) Applicant: FUJI ELECTRIC CO., LTD., Kawasaski (JP)

(72) Inventors: Masaaki Tachioka, Matsumoto-city (JP); Takashi Saito, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 239 days.

(21) Appl. No.: 17/587,785

(22) Filed: Jan. 28, 2022

(65) Prior Publication Data

US 2022/0310548 A1 Sep. 29, 2022

(30) Foreign Application Priority Data

Mar. 25, 2021 (JP) ................................ 2021-051833

(51) Int. Cl.
*H01L 23/00* (2006.01)
*H01L 23/31* (2006.01)
(Continued)

(52) U.S. Cl.
CPC ........ *H10W 40/255* (2026.01); *H10W 74/114* (2026.01); *H10W 72/325* (2026.01);
(Continued)

(58) Field of Classification Search
CPC ......... H01L 24/32; H01L 24/29; H01L 24/37; H01L 24/40; H01L 24/45; H01L 24/48;
(Continued)

(56) References Cited

U.S. PATENT DOCUMENTS

2010/0032826 A1* 2/2010 Tachibana ............... C08L 63/00 257/737
2010/0279469 A1* 11/2010 Jin ............................ C09J 7/38 525/476

(Continued)

FOREIGN PATENT DOCUMENTS

JP 06-244463 A 9/1994
JP 2015-164165 A 9/2015

(Continued)

OTHER PUBLICATIONS

Japanese Office Action dated Nov. 6, 2024 for Japanese Application No. 2021-051833.

(Continued)

*Primary Examiner* — Leonard Chang
*Assistant Examiner* — Stanetta D Isaac

(57) ABSTRACT

An object is to provide highly reliable semiconductor element bonding portion and semiconductor device that have high heat resistance and improved adhesion between a bonding material and a sealing resin. Provided is a semiconductor element bonding portion in which the semiconductor element 11 and an electrically conductive plate **123*a* are bonded to each other by a bonding layer 10 and the bonding layer 10 includes a metal nanoparticle sintered body 101 and a coupling agent 102** including an SH group.

16 Claims, 1 Drawing Sheet

(51) Int. Cl.
*H01L 23/373* (2006.01)
*H10W 40/25* (2026.01)
*H10W 72/00* (2026.01)
*H10W 72/30* (2026.01)
*H10W 74/10* (2026.01)
*H10W 90/00* (2026.01)

(52) U.S. Cl.
CPC ........ *H10W 72/352* (2026.01); *H10W 72/353* (2026.01); *H10W 72/884* (2026.01); *H10W 90/736* (2026.01)

(58) Field of Classification Search
CPC ..................... H01L 24/27; H01L 24/83; H01L 2224/29293; H01L 2224/29339; H01L 2224/29344; H01L 2224/29347; H01L 2224/32245; H01L 2224/73265; H01L 2224/05639; H01L 2224/05644; H01L 2224/05647; H01L 2224/05655; H01L 2224/05666; H01L 2224/27318; H01L 2224/27312; H01L 2224/2732; H01L 2224/27334; H01L 2224/27505; H01L 2224/2782; H01L 2224/27848; H01L 2224/291; H01L 2224/29194; H01L 2224/2929; H01L 2224/29294; H01L 2224/293; H01L 2224/29386; H01L 2224/32227; H01L 2224/37147; H01L 2224/37655; H01L 2224/37671; H01L 2224/40227; H01L 2224/45124; H01L 2224/48247; H01L 2224/73221; H01L 2224/73263; H01L 2224/83009; H01L 2224/83065; H01L 2224/83075; H01L 2224/83192; H01L 2224/83203; H01L 2224/8384; H01L 2224/83862; H01L 2924/10253; H01L 2924/10254; H01L 2924/10272; H01L 2924/1033; H01L 2924/1037; H01L 2924/171; H01L 2924/181; H01L 2924/351; H01L 2924/3512; H01L 2924/35121; H01L 23/3121; H01L 23/3735; H01L 23/053; H01L 23/24; H01L 23/36; H10W 90/736; H10W 90/734; H10W 90/756; H10W 90/764; H10W 76/10; H10W 76/15; H10W 76/47; H10W 72/325; H10W 72/352; H10W 72/353; H10W 72/884; H10W 72/01315; H10W 72/01323; H10W 72/01325; H10W 72/01361; H10W 72/01365; H10W 72/073; H10W 72/07311; H10W 72/07331; H10W 72/07332; H10W 72/07338; H10W 72/07341; H10W 72/354; H10W 72/5524; H10W 72/652; H10W 72/655; H10W 72/871; H10W 72/886; H10W 72/952
See application file for complete search history.

(56) References Cited

U.S. PATENT DOCUMENTS

2015/0359105 A1* 12/2015 Yoon .................... C09D 129/04
174/268
2016/0113107 A1* 4/2016 Wang ................... H05K 3/3431
361/783
2019/0355690 A1* 11/2019 Nakako ................... B22F 7/064

FOREIGN PATENT DOCUMENTS

JP 2018-49939 A 3/2018
JP 2019-57586 A 4/2019

OTHER PUBLICATIONS

Silane Coupling Agents, “Combination of Organic and Inorganic Materials”, Resins & Oligomers, Silanes Products Selection Guide, by Shin-Etsu Chemical Co., Ltd., 2017.6/2023.10, 28 pages.
2-Mercaptoethanol, https://en.wikipedia.org/w/index.php?title=2-Mercaptoethanol&oldid=1195472662 (last visited Feb. 27, 2024), printed Feb. 27, 2024, 5 pages.

* cited by examiner

SEMICONDUCTOR ELEMENT BONDING PORTION AND SEMICONDUCTOR DEVICE

CROSS-REFERENCE TO RELATED APPLICATION

This Application claims priority from Japanese Patent Application No. 2021-051833, filed on Mar. 25, 2021, which is incorporated herein by reference in their entirety.

BACKGROUND OF THE INVENTION

Field of the Invention

The present invention relates to a semiconductor element bonding portion and a semiconductor device. The present invention particularly relates to a highly reliable semiconductor element bonding portion and semiconductor device that have high heat resistance and improved adhesion between a bonding layer and a sealant.

Description of Related Art

Power semiconductor modules are widely used in fields in which efficient electric power conversion is required. For example, use is spreading to the field of power electronics such as industrial machines, electric cars, and home electric appliances. These power semiconductor modules include switching elements and diodes, and Si (silicon) semiconductors and SiC (silicon carbide) semiconductors are used in the elements.

Solder has been conventionally used for bonding between an element and a laminated substrate in a power semiconductor module. In recent years, demand for improving heat resistance of a power semiconductor module is increasing due to reduction in size and increase in current density of the module, and a module using a metal particle sintered body instead of solder is proposed (for example, see Patent Literatures 1 and 2).

Moreover, a demand for higher reliability in a power semiconductor module is also increasing. Adhesion between a sealant and a module member is important in improving reliability, and use of a primer such as polyimide or polyimide-amide at an interface between the sealant and the module member is proposed to improve the adhesion (for example, see Patent Literature 1). The primer is a low-elasticity material and is considered to have an effect of reducing stress at the interface between the sealant and the module member.

CITATION LIST

Patent Literature

[Patent Literature 1] Japanese Patent Application Publication No. 2015-164165

[Patent Literature 2] Japanese Patent Application Publication No. H06-244463 (1992-244463)

SUMMARY OF THE INVENTION

However, in a power semiconductor module using the metal particle sintered body as a bonding material, there is a risk of occurrence of cracking and peeling between the sealant and the bonding material and cracking in the sintered body. In the technique of Patent Literature 1, stress reduction is attempted by using the primer layer. However, the aforementioned problem of cracking and the like cannot be solved only by the stress reduction effect of the primer layer in some cases.

The present inventors discovered a configuration of coating a metal nanoparticle sintered body with a specific coupling agent in a case in which a bonding portion between a semiconductor element and a laminated substrate is formed with the metal nanoparticle sintered body used as a bonding material, to suppress cracking and peeling between a bonding layer and a sealant formed around the bonding portion and cracking in the sintered body and to form the bonding portion with high reliability, and completed the present invention.

An embodiment of the present invention relates to a semiconductor element bonding portion which includes a semiconductor element; a laminated substrate; and a bonding layer that bonds the semiconductor element and the laminated substrate to each other. The bonding layer includes a sintered body of a metal nanoparticle and a silane coupling agent including an SH group.

Preferably, in the bonding layer of the semiconductor element bonding portion, the sintered body of the metal nanoparticle is coated with the silane coupling agent.

Preferably, in the semiconductor element bonding portion, the metal nanoparticle is one or more particles selected from a group consisting of a silver nanoparticle, a copper nanoparticle, and a gold nanoparticle.

Preferably, in the semiconductor element bonding portion, the semiconductor element includes a gold electrode on a contact surface with the bonding layer.

Another embodiment of the present invention relates to a semiconductor device which includes sealed members including an electrically conductive connection member and a semiconductor element mounted on a laminated substrate; a sealant that seals the sealed members; and any one of the above-described semiconductor element bonding portions.

Preferably, in the semiconductor device, the sealant contains a thermosetting resin curing agent.

Preferably, the semiconductor device further includes a primer layer at an interface between the sealant and each of the sealed members including the bonding layer, the semiconductor element, and the electrically conductive connection member.

Preferably, in the semiconductor device, the semiconductor element is an Si or wide-bandgap semiconductor element The present invention can provide a highly reliable semiconductor element bonding portion that has high heat resistance and in which cracking in a bonding layer between a semiconductor element and an electrically conductive plate and peeling between the bonding layer and a sealant around the bonding layer are suppressed, and a semiconductor device including the same.

DESCRIPTION OF PREFERRED EMBODIMENT

An embodiment of the present invention is described below with reference to the drawings. Note that the present invention is not limited by the embodiment described below.

Figure 1:
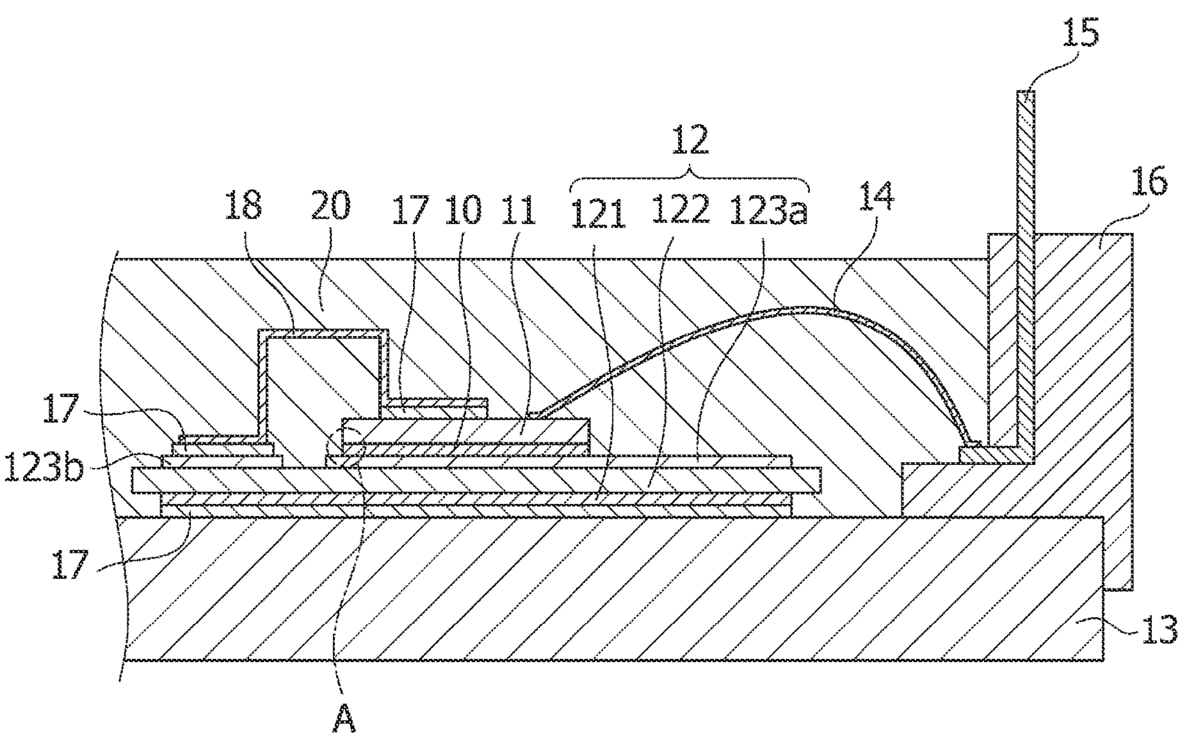
FIG. 1 is a schematic cross-sectional view illustrating a cross-sectional structure of a semiconductor device in an embodiment of the present invention.
Figure 2:
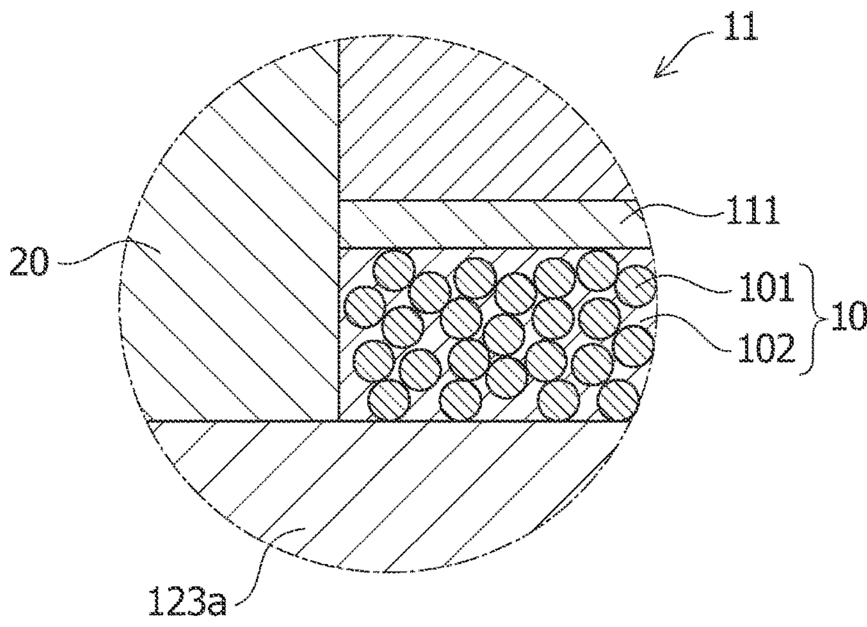
FIG. 2 is an enlarged cross-sectional view of a portion A in FIG. 1 and is a schematic cross-sectional view illustrating a cross-sectional structure of a semiconductor element bonding portion in the embodiment of the present invention.

The embodiment of the present invention relates to a semiconductor element bonding portion and a semiconductor device including the same. FIG. 1 is a schematic cross-sectional view of a power semiconductor module that is an example of the semiconductor device according to the embodiment and FIG. 2 is an enlarged cross-sectional view of portion A in FIG. 1. With reference to FIGS. 1 and 2, the power semiconductor module includes a semiconductor element bonding portion in which a semiconductor element 11 and a laminated substrate 12 are bonded to each other by a bonding layer 10 on a heat dissipation plate 13. A case 16 including an external terminal 15 therein is attached to the heat dissipation plate 13. The semiconductor element 11 and a second electrically conductive plate 123*b* of the laminated substrate 12 are connected to a lead frame 18 via bonding layers 17 and the external terminal 15 is connected to an upper portion of the semiconductor element 11 by an aluminum wire 14. Moreover, the inside of the case 16 is filled with a sealant 20.

The semiconductor element 11 is a power chip such as an insulated gate bipolar transistor (IGBT) or a diode chip and may be an Si device or a wide-bandgap semiconductor device such as an SiC device, a GaN device, a diamond device, or a ZnO device. Moreover, two or more of these devices may be used in combination. For example, a device such as a hybrid module using a Si-IGBT and an SiC-SBD can be used. The number of mounted semiconductor elements may be one or more. It is preferable that the semiconductor element 11 include a front-side electrode (not-illustrated) and a back electrode 111 bonded to the laminated substrate 12 and that the back electrode 11I is a gold electrode. The back electrode 111 comes into contact with the bonding layer 10 to form the semiconductor element bonding portion in the embodiment. Note that a metal layer is formed in the back electrode. Cu, Ag, and Au are preferable as the metal layer from the viewpoint of a bonding property with a metal nanoparticle sintered body, and Ag and Au are more preferable, although Ti, Ni, and the like can also be used as the metal layer.

The laminated substrate 12 can be formed of an insulation substrate 122, a first electrically conductive plate 121 formed on one of the main surfaces of the insulation substrate 122, and second electrically conductive plates 123*a* and 123*b* formed on the other one of the main surfaces. A material with excellent electric insulating property and thermal conductivity can be used as the material of the insulation substrate 122. Examples of the material of the insulation substrate 122 may include $Al_2O_3$, AlN, SiN, and the like. Particularly, in high-withstand voltage application, a material achieving both good electrical insulating property and good thermal conductivity is preferable, and AlN and SiN can be used. However, the material is not limited to these. A metal material such as Cu and Al with excellent workability can be used as the material of the first electrically conductive plate 121 and the second electrically conductive plates 123*a* and 123*b*. Moreover, the electrically conductive plates may be Cu or Al subjected to treatment such as Ni plating for the purpose of rust-proofing. A direct copper bonding method and an active metal brazing method can be given as methods of disposing the electrically conductive plates 121, 123*a*, and 123*b* on the insulation substrate 122. In the illustrated embodiment, the two second electrically conductive plates 123*a* and 123*b* are non-continuously provided on the insulation substrate 122 and the one plate 123*a* is an electrode bonded to the semiconductor element 11 and the other plate 123*b* is the electrode connected to the lead frame 18. In the illustrated power semiconductor module, the second electrically conductive plate 123*a* comes into contact with the bonding layer 10 and forms the semiconductor element bonding portion in the embodiment.

The lead frame 18 is an electrically conductive connection member that connects the semiconductor element 11 and the second electrically conductive plate 123*b* to each other. The lead frame 18 may be a metal such as copper or an alloy containing copper. An Ni or Ni alloy layer or a Cr or Cr alloy layer may be formed on a surface of the lead frame 18 by plating or the like. In this case, film thickness of the Ni or Ni alloy layer or the Cr or Cr alloy layer can be set to about 20 μm or less.

A metal such as copper or aluminum with excellent thermal conductivity is used for the heat dissipation plate 13. Moreover, the heat dissipation plate 13 may be coated with Ni or Ni alloy for corrosion proofing.

The case 16 may be a thermoplastic resin such as polyphenylene sulfide (PPS) or polybutylene terephthalate (PBT).

The bonding layer 10 that bonds the back electrode of the semiconductor element 11 and the second electrically conductive plate 123*a* to each other contains a metal nanoparticle sintered body and a silane coupling agent including a SH group (also referred to as mercapto group or thiol group). The semiconductor element 11, the laminated substrate 12 (second electrically conductive plate 123*a*), and the bonding layer 10 bonding these elements to each other to form the semiconductor element bonding portion according to the present invention.

The metal nanoparticle sintered body refers to a porous metal body in which metal particles (metal nanoparticles) with an average particle size of about 1 to 200 nm are sintered and bonded to one another to be continuous. The sintered porous metal body may include voids in some cases. The metal nanoparticles may be particles made of silver, copper, gold, or a mixture of two or more of these materials.

Among these types of metal nanoparticles, the silver nanoparticles are easy to sinter at low temperature of 250° C. or below and are used for general purposes. Moreover, since the silver nanoparticles have high adhesiveness, they are used particularly in applications requiring strength such as in-vehicle applications. The gold nanoparticles are easy to sinter at low temperatures of 250° C. or below and are less likely to be oxidized. Accordingly, the gold nanoparticles are used in a semiconductor module that requires resistance to harsher environments. The sintering temperature of the copper nanoparticles in the bonding is high and the copper nanoparticles are particularly preferable in applications in a semiconductor module that is used at high temperatures and in which the device operation temperature is 200° C. or higher. Moreover, in the present invention, when the bonded material, for example, the surface metal layer of the back electrode is Au or Ag, the metal nanoparticles are preferably Au, Ag, or Cu, more preferably Ag. This is because the metal nanoparticles can be bonded onto the surface metal layer while having the same crystal orientation as that of the surface metal layer. Although bonding of pieces of the same metal is preferable, the Ag nanoparticles can be also bonded onto Au in an excellent manner. Moreover, when the bonded material is Cu, the metal nanoparticles are preferably Au. Ag, or Cu, more preferably Cu or Ag from the viewpoint of bonding properties.

The silane coupling agent is a silane coupling agent including an SH group and an alkoxy group directly bonded to an Si atom in one molecule. The silane coupling agent may be particularly a compound expressed by SH-A-Si $(OR^1)_n(R^2)_{3-n}$ (in the formula. A is a linear or branched, saturated or unsaturated hydrocarbon group, $R^1$ and $R^2$ are independent from each other and are each a linear or branched hydrocarbon group with a carbon number of 1 to 3, and n is an integer selected from 1 to 3). A is preferably a linear hydrocarbon group with a carbon number of 1 to 6, more preferably a linear hydrocarbon group with a carbon number of 1 to 3. $R^1$ and $R^2$ are preferably independent from each other and are each preferably an ethyl group or a methyl group.

Specific examples of the silane coupling agent may include 3-mercaptopropylmethyldimethoxysilane, 3-mercaptopropyltrimethoxysilane, and the like but are not limited to these. Multiple different silane coupling agents can be mixed and used.

In the bonding layer 10, a mixing ratio of the metal nanoparticle sintered body and the coupling agent diluted 10 times may be, for example, 1:0.7 to 1:1.3, preferably, 1:0.9 to 1:1.1 in volume ratio. The volume ratio refers to a volume ratio before the formation of the bonding layer, that is before heating. Mixing the metal nanoparticle sintered body and the coupling agent at such a ratio allows the voids in the porous body formed of the metal nanoparticle sintered body and a periphery of the porous body to be filled with the coupling agent, and the surface of the metal nanoparticle sintered body can be substantially coated with the coupling agent. When the dilution ratio is different from that described above, the metal nanoparticle sintered body and the coupling agent can be mixed according to the aforementioned preferable volume ratio range to achieve a predetermined volume ratio.

In one mode, the bonding layer 10 preferably contains no thermosetting resin. This is because this configuration can prevent cracking of the bonding layer. When a thermal cycle is applied to the bonding layer 10 with the thermosetting resin entering the inside (voids) of the metal nanoparticle sintered body, thermal stress is generated between the porous metal body made of the metal nanoparticle sintered body and the thermosetting resin forming the sealant and peeling occurs at an interface between the metal body and the resin in some cases. Note that, in the present invention, since the coupling agent enters the voids, the voids decrease and the thermosetting resin and the like are less likely to enter the voids.

In one mode, the bonding layer 10 is made of the metal nanoparticle sintered body and a predetermined silane coupling agent. This configuration improves bonding between the porous metal body made of the metal nanoparticle sintered body in the bonding layer and the thermosetting resin forming the sealant. Moreover, it is possible to obtain advantages such that bonding between the metal particles forming the metal nanoparticle sintered body is improved and bonding between the bonded material metal surface (for example, the back electrode of the semiconductor element) and the metal nanoparticles is improved.

The thickness of the bonding layer 10 is preferably 10 μm to 300 μm, and more preferably 15 μm to 60 μm. The thickness of the bonding layer 10 refers to thickness after sintering.

The bonding layers 17 other than the bonding layer 10 in contact with the back electrode 111 of the semiconductor element 11 can have the same configuration as the bonding layer 10. Alternatively, in the bonding layer 17, solder, an electrically conductive adhesive (for example, silver paste) of metal particles with a particle size of about 0.5 μm to 100 μm, or the like can be used instead of the metal nanoparticle sintered body, and the usable materials are not limited to these. The electrically conductive adhesive is an adhesive obtained by dispersing metal particles such as silver with a particle size of about 0.5 μm to 100 μm in a thermosetting resin and forming a paste. After being heated and sintered, the electrically conductive adhesive has electrical conductivity in a form in which the thermosetting resin surrounds a connected body of the metal particles, and has lower stiffness than the metal nanoparticle sintered body. When the bonding layer 10 is used for the back side of the semiconductor element, it is preferable to use a bonding material with low stiffness such as the aforementioned solder and a sintered body of metal paste for the bonding of the lead frame and the upper portion of the semiconductor element. This is because the solder and the metal paste sintered body are assumed to have an effect of reducing strain caused by thermal stress.

The inside of the case 16 is filled with the sealant 20. The sealant 20 insulates and seals members including the semiconductor element 11, the bonding layer 10, the laminated substrate 12, the aluminum wire 14, the external terminal 15, and the lead frame 18. The sealant 20 can be made of a thermosetting resin composition and is particularly preferably made of a thermosetting resin composition with high thermal resistance. The thermosetting resin composition contains a thermosetting resin main agent and may optionally contain an inorganic filler, a curing agent, a curing accelerator, and a necessary additive.

The thermosetting resin main agent is not limited to a particular agent, and examples thereof include an epoxy resin, a polyamide resin, a maleimide resin, and the like. Among these, an epoxy resin including at least two epoxy groups in one molecule is particularly preferable because this epoxy resin has high dimension stability, water resistance, chemical resistance, and electrical insulation property. Specifically, an aliphatic epoxy resin, an alicyclic epoxy resin, or a mixture of these resins is preferably used.

The aliphatic epoxy resin is referred to as an epoxy compound in which carbon, to which the epoxy group is directly bonded, is carbon, forming an aliphatic hydrocarbon. Accordingly, a compound containing an aromatic ring in a main skeleton and satisfying the aforementioned condition is categorized as the aliphatic epoxy resin. Examples of the aliphatic epoxy resin may include bisphenol A type epoxy resin, bisphenol F type epoxy resin, bisphenol AD type epoxy resin, biphenyl type epoxy resin, naphthalene type epoxy resin, cresol novolac type epoxy resin, polyfunctional epoxy resin that is at least trifunctional, and the like, but are not limited to these resins. Any of these resins can be used alone, or two or more of these resins can be mixed and used. Moreover, since the naphthalene type epoxy resin and the polyfunctional epoxy resin that is at least trifunctional have high glass transition temperatures, these resins are also referred to as high thermal resistance epoxy resins. Containing these high thermal resistance epoxy resins can improve thermal resistance.

The alicyclic epoxy resin is referred to as an epoxy compound in which two carbon atoms forming an epoxy group form an alicyclic compound. Examples of the alicyclic epoxy resin may include a monofunctional epoxy resin, a bifunctional epoxy resin, a poly functional epoxy resin that is at least trifunctional, and the like but are not limited to these resins. Also, in the case of the alicyclic epoxy resin, any of these resins can be used alone, or two or more of these resins can be mixed and used. Note that, when the alicyclic epoxy resin is mixed with an acid anhydride curing agent and cured, the glass transition temperature increases.

Accordingly, the thermal resistance can be improved by mixing the alicyclic epoxy resin into the aliphatic epoxy resin and using it.

The thermosetting resin main agent used in the thermosetting resin composition may be an agent obtained by mixing the aforementioned aliphatic epoxy resin and alicyclic epoxy resin. A mixing ratio in the case of the mixing may be any ratio. The mass ratio between the aliphatic epoxy resin and the alicyclic epoxy resin may be about 2:8 to 8:2 or about 3:7 to 7:3, and is not limited to a particular mass ratio. The thermosetting resin main agent is preferably an agent in which the mass ratio between the bisphenol A type epoxy resin and the alicyclic epoxy resin is 1:1 to 1:4.

The thermosetting resin composition may contain an inorganic filler as an optional component. The inorganic filler may be a metal oxide or a metal nitride, and examples of the inorganic filler may include molten silica, silica, alumina, aluminum hydroxide, titania, zirconia, aluminum nitride, talc, clay, mica, glass fiber, and the like, but are not limited to these. These inorganic fillers can improve thermal conductivity of the cured body and reduce the coefficient of thermal expansion. Any of these inorganic fillers may be used alone, or two or more types of these fillers may be mixed and used. Moreover, these inorganic fillers may be micro-fillers or nano-fillers and two or more types of inorganic fillers that vary in particle size or type can be mixed and used. In particular, an inorganic filler with an average particle size of about 0.2 to 20 μm is preferably used. The addition amount of the inorganic filler is preferably 100 to 600 parts by mass, more preferably 200 to 400 parts by mass, when the total mass of the thermosetting resin main agent and the curing agent that may be optionally contained is 100 parts by mass. When the blend amount of the inorganic filler is less than 100 parts by mass, the coefficient of the thermal expansion of the sealant increases and a possibility of occurrence of peeling and cracking increases in some cases. When the blend amount is greater than 6(0) parts by mass, the viscosity of the composition increases and the extrusion property becomes poorer in some cases.

The thermosetting resin composition may contain a curing agent as an optional component, in addition to the thermosetting resin main agent or to the thermosetting resin main agent and the inorganic filler. Although the curing agent is not limited to a particular agent so long as it reacts with the thermosetting resin main agent, preferably, the epoxy resin main agent and cures the main agent, an acid anhydride curing agent is preferably used. Examples of the acid anhydride curing agent may include aromatic acid anhydrides, specifically, phthalic anhydride, pyromellitic dianhydride, trimellitic anhydride, and the like. Moreover, the examples may also include cyclic aliphatic acid anhydrides, specifically, tetrahydrophthalic anhydride, methyltetrahydrophthalic anhydride, hexahydrophthalic anhydride, methylhexahydrophthalic anhydride, methylnadic anhydride, and the like and aliphatic acid anhydrides, specifically, succinic anhydride, poly(adipic anhydride), poly(sebacic anhydride), poly(azelaic anhydride), and the like. The blend amount of the curing agent is preferably about 50 parts by mass or more and 170 parts by mass or less, more preferably about 80 parts by mass or more and 150 parts by mass or less with respect to 100 parts by mass of the epoxy resin main agent. When the blend amount of the curing agent is less than 50 parts by mass, the glass transition temperature drops due to insufficient cross-linking in some cases. When the blend amount is more than 170 parts by mass, humidity resistance, high heat distortion temperature, and thermal stability decrease in some cases. Note that when the bisphenol A type epoxy resin, alone or a mixture of the bisphenol A type epoxy resin and the aforementioned high thermal resistance epoxy resin, is used as the thermosetting resin main agent, it may be preferable not to use the curing agent because this improves the thermal resistance. The blend ratio of the high thermal resistance epoxy resin is, for example, 10 mass % or more and 50 mass % or less, more preferably, 10 mass % or more and 25 mass % or less, when the total mass of the thermosetting resin main agent is 100%. This range is preferable because the thermal resistance is improved and the viscosity does not increase within this range.

A curing accelerator may be further added to the thermosetting resin composition as an optional component. Imidazole or derivatives thereof, tertiary amine, borate ester, Lewis acid, organic metal compounds, organic acid metal salts, and the like can be appropriately blended as the curing accelerator. The addition amount of the curing accelerator is preferably 0.01 parts by mass or more and 50 parts by mass or less, more preferably, 0.1 parts by mass or more and 20 parts by mass or less relative to 100 parts by mass of the epoxy resin main agent.

The thermosetting resin composition may also contain an optional additive within such a range that the characteristics of the thermosetting resin composition are not hindered. Examples of the additive may include flame retardant, pigments for coloring the resin, and plasticizer and silicone elastomer for improving crack resistance, but are not limited to these. Those skilled in the art can determine these optional components and the addition amounts thereof as appropriate depending on the specifications required for the semiconductor device and/or the sealant.

The sealant 20 filling the inside of the case is cured while being in contact with the members including the semiconductor element 11, the bonding layers 10 and 17, the laminated substrate 12, and the lead frame 18 and insulates and seals these members. With reference to FIG. 2, the sealant 20 and the bonding layer 10 are in contact with each other also in the semiconductor element bonding portion including the semiconductor element 11, the bonding layer 10, and the electrically conductive plate 123*a*. According to the embodiment, a metal nanoparticle sintered body 101 forming the bonding layer 10 is present in a state substantially coated with a coupling agent 102. Accordingly, the coupling agent 102 is mainly arranged at an interface to the sealant 20. Covalent bonds can thus be formed between reactive functional groups present in the coupling agent 102 and functional groups included in the thermosetting resin forming the sealant 20. It is thus possible to secure adhesiveness between the bonding layer 10 and the sealant 20 and prevent peeling and cracking.

In the embodiment, the members including the semiconductor element 11, the bonding layers 10 and 17, the laminated substrate 12, and the lead frame 18 are also referred to as sealed members. A primer layer may be formed on the sealed members members illustrated in FIG. 1. The primer layer may be a layer made of a resin containing polyamide, polyimide, or polyamide-imide. Since the primer layer can improve adhesiveness at an interface between the sealant and each of the laminated substrate 12 (particularly, the electrically conductive plates 123*a* and 123*b*), the heat dissipation plate 13, the case 16 (inner surface), and the electrically conductive connection members such as the bonding layers 10 and 17, the lead frame 18, and the aluminum wire 14 and reduce stress, the primer layer is advantageously used in some cases. The thickness of the primer layer is not limited to particular thicknesses so long as the primer layer can provide adhesiveness and reduce stress. The thickness of the primer layer can be, for example, about 1 to 15 μm, preferably, 2 to 10 μm. When the primer layer is provided, the primer layer can be provided to coat the entire surfaces of the aforementioned members. When the primer layer is provided to be in contact with the bonding layer 10, covalent bonds can be formed between the resin forming the primer layer and the coupling agent 102. Thus, it is possible secure the adhesiveness between the bonding laver 10 and the primer layer and the adhesiveness between the primer layer and the sealant 20 and prevent peeling and cracking.

Manufacturing of the power semiconductor module in the aforementioned mode is described. First, the semiconductor element bonding portion is manufactured by bonding the semiconductor element 11 and the laminated substrate 12 with the bonding layer 10. The manufacturing is described below while giving an example of a method of forming the semiconductor element bonding portion.

According to one mode, the method of forming the semiconductor element bonding portion includes the following steps.

1. Setting a metal bonding material that is a material for forming the metal nanoparticle sintered body, on the electrically conductive plate 123*a* of the laminated substrate 12.
2. Dropping the coupling agent onto the metal bonding material.
3. Leaving the metal bonding material and the coupling agent to stand with the metal bonding material and the coupling agent in contact with each other.
4. Performing sintering in a state in which the back electrode of the semiconductor element 11 is on and in contact with the metal bonding material and the coupling agent.

In step 1, the metal bonding material used to form the metal nanoparticle sintered body is prepared. A metal nanoparticle bonding material or silver oxide microparticle bonding material can be used as the metal bonding material.

When the particle size of the fine particles of metal such as silver, gold, or copper is a nano-size, bonding can be performed substantially at or below 400° C. that is lower than the melting point of a bulk material of each metal and this bonding method is referred to as a nanoparticle bonding method. When the metal nanoparticle sintered body is to be formed by using the nanoparticle bonding method, the metal nanoparticle bonding material can be used as the metal bonding material. The metal nanoparticle bonding material may be a bonding material obtained by covering surfaces of the nano-size metal particles with an organic substance to prevent agglomeration and improve dispersibility in solvent and forming a paste. Accordingly, the metal nanoparticle bonding material contains the metal nanoparticles and the organic solvent. A sheet-shaped bonding material can be used as the metal nanoparticle bonding material. A commercially available sheet-shaped bonding material can be used as the sheet-shaped bonding material. Alternatively, the sheet-shaped bonding material may be a bonding material formed in a predetermined shape with predetermined thickness by applying a paste-type bonding material for a metal nanoparticle sintered layer by using a printing method or a dispenser, and the bonding material may be dried and temporarily cured at 100° C. to 150° C. for about 0.5 hours to 2 hours.

The silver oxide microparticle bonding material may also be used as the metal bonding material. A sintered body formed of nano-size silver particles can be manufactured by adding an alcohol-based solvent to a bonding material, obtained by forming micro-size silver oxide particles and a reducing solvent with a reducing action into a paste, to reduce silver oxide at relatively low temperature of about 400° C. or below. This method is a bonding mode similar to the nanoparticle bonding method, and although the starting material and the mechanism of reaction are different, is the same as the nanoparticle bonding method in that the metal nanoparticle sintered body can be eventually obtained. The silver oxide microparticle bonding material may also be formed in a sheet-shape and be used.

In step 2, the silane coupling agent is dropped on the metal bonding material formed in step 1. The silane coupling agent can be dropped in a fluid form. The silane coupling agent can be used while being diluted with ethanol, methanol, water, or the like as necessary and preferably has a viscosity of about 1 to 50 mPa s. This viscosity range is preferable because setting the viscosity within this range allows the metal nanoparticle bonding material to be impregnated with the silane coupling agent such that the silane coupling agent is diffused across the entire metal nanoparticle bonding material, while avoiding spreading of the silane coupling agent in the step of dropping thereof. An environment of the dropping is preferably an atmosphere of normal temperature and normal pressure with humidity of about 40% RH to 70% RH.

In step 3, the metal bonding material and the silane coupling agent are left to stand for about 5 to 20 minutes, preferably about 10 minutes, to cause the silane coupling agent to spread into the metal bonding material. Environmental conditions can be the same as those in step 2.

In step 4, the sintering may be performed under no pressure or under pressure. For example, when the sintering is performed under no pressure, heating can be performed at 200° C. to 350° C. for about 30 to 120 minutes under the atmosphere, $N_2$, or a reducing atmosphere of $H_2$, formic acid, or the like. Alternatively, the bonding can be performed in a short time of about 1 to 10 minutes under pressure of 5 to 40 MPa, at the same atmosphere and temperature as those in the case of no pressure. The semiconductor element bonding portion formed of the semiconductor element 11, the bonding layer 10, and the laminated substrate 12 is thereby obtained. Thereafter, the primer and the sealant resin are formed around the bonding layer 10. In the bonding layer 10 formed as in the steps described above, the silane coupling agent can achieve excellent bonding between the sealant resin and the porous metal body made of the metal nanoparticles, bonding between the metal nanoparticles, and in addition, excellent bonding between the metal nanoparticles and the metal (Au or Ag) on the back surface of the semiconductor element that is the bonded material.

A method in which the metal nanoparticle sintered body is formed first and then the formed sintered body is filled with the silane coupling agent can be given as another example of the method of forming the bonding layer. A procedure of this method is as follows. The metal nanoparticle sintered body can be formed by first arranging the metal bonding material as in step 1 and then completely sintering the metal bonding material in the same sintering conditions as those in step 4. Then, the coupling agent is dropped on the metal nanoparticle sintered body in the same method as that in step 2, the semiconductor element is arranged, and the silane coupling agent can be made to react. Reaction conditions of the silane coupling agent may be such that the silane coupling agent is made to react under a pressure of 1 to 10 MPa at 100° C. to 200° C. for about 0.5 hours to 2 hours. In this method, the adhesion strength between the semiconductor element and the bonding layer 10 may be lower than that in the method in which the aforementioned steps 1 to 4 are performed, in this order. This is because bonding between the metal nanoparticle sintered body and the metal (bonded material) on the back surface of the semiconductor element is achieved mainly by the silane coupling agent and there are few bonding points.

In yet another example of the method of forming the bonding layer, there is a method in which, after step 1, the semiconductor element 11 and the electrically conductive plate 123*a* of the laminated substrate 12 are bonded to each other by the metal bonding material as in step 4 to form the bonding layer made of the metal nanoparticle sintered body. Then, the silane coupling agent may be applied from a periphery of the porous bonding layer formed of the metal nanoparticle sintered body, and made to enter the voids and react. Reaction conditions in this case may be such that the silane coupling agent is made to react under pressure of 1 to 10 MPa at 100° C. to 200° C. for about 0.5 hours to 2 hours.

Regarding the manufacturing of the power semiconductor module, the lead frame 18 is further mounted on the semiconductor element 11, the laminated substrate 12 and the heat dissipation plate 13 are bonded to each other, the case 16 is attached, and then wire bonding is performed by using the aluminum wire 14. Next, sealing using the sealant can be performed.

In a semiconductor module including the primer layer, the primer layer is formed after the wire bonding. The primer layer can be provided on the semiconductor element 11, the bonding layer 10, the laminated substrate 12, the lead frame 18, the aluminum wire 14, and the case 16 by, for example, spraying or the like.

The sealing is performed by pouring the thermosetting resin composition forming the sealant into the case 16 and heating and curing the thermosetting resin composition. The step of heating and curing may be, for example, two-stage curing. When an epoxy resin is used as the thermosetting resin main agent, the step of heating and curing may be performed in three stages of heating at 80° C. to 120° C. for 1 to 2 hours, heating at 120° C. to 160° C. for 1 to 2 hours, and heating at 170° C. to 190° C. for 1 to 2 hours. However, temperature and time are not limited to a particular temperature and time, and the steps of heating and curing do not have to be the three-stage curing. This sealing step can form covalent bond between the coupling agent 102 and the metal nanoparticle sintered body 101 and between the coupling agent 102 and the sealant 20 or the primer layer and form covalent bond between the coupling agent 102 and the back electrode 111 of the semiconductor element 11 and can improve adhesiveness between the members.

Note that the illustrated configuration of the power semiconductor module is an example and the present invention is not limited to this configuration. For example, the power semiconductor module may use any electrically conductive connection member and may also use an implant pin. Moreover, the power semiconductor module may have a configuration in which the electrically conductive connection wide-bandgap member includes only the lead frame or only the wire. In a module including the implant pin as the electrically conductive connection member, the primer layer can be formed on a surface of the implant pin. In a module having the configuration in which the electrically conductive connection member includes only the wire, the primer layer can be formed on a surface of the wire. However, in both configurations, there are cases in which no primer layer is formed. Moreover, the power semiconductor module may have a configuring in which no case is provided and the outer shape of the module is formed of molded sealant.

For example, the following structure can be given as a structure of a case-less power semiconductor module. Although not illustrated, the case-less power semiconductor module includes an implant pin and a printed circuit board bonded to the implant pin instead of the aluminum wire in FIG. 1 and the members including the implant pin and the printed circuit board are sealed by the sealant. A board in which an electrically conductive layer of Cu, Al, or the like is formed on a polyimide film substrate or an epoxy film substrate can be used as the printed circuit board. A copper pin using copper can be used as the implant pin. The electrically conductive layer of the printed circuit board and the implant pin may be Cu or Al subjected to treatment such as Ni plating for the purpose of rust-proofing. The printed circuit board and the implant pin electrically connect the semiconductor elements or the semiconductor element and the laminated substrate to each other. The implant pin and the laminated substrate or the semiconductor element can be bonded to each other by the metal particle sintered body or a solder bonding layer. Moreover, leading out the implant pin from a surface of the laminated substrate to the outside of the sealant allows the implant pin to be used as an external connection terminal. In manufacturing of the power semiconductor module in the aforementioned mode, the sealed members including the laminated substrate, the semiconductor element, the implant pin, and the printed circuit board are assembled, the primer layer is optionally formed on the surface of the implant pin by a method such as spraying, then the sealed members are placed in an appropriate mold, the mold is filled with the sealant, and the sealant is heated and cured. Vacuum casting, transfer molding, and liquid transfer molding can be given as the molding method of such a sealed body but the molding method is not limited to a predetermined molding method.

Providing the semiconductor element bonding portion according to the embodiment can prevent peeling and cracking between the sealant and the other members irrespective of the structure of the power semiconductor module and enables manufacturing of a semiconductor device with high reliability.

EXAMPLES

The present invention is described below in further detail by giving examples of the present invention. Note that the present invention is not limited to the scope of the following examples.

(1) Manufacturing of Power Semiconductor Module

The power semiconductor module illustrated in FIG. 1 was manufactured for each example. A sheet material ALPHA Argomax 8050 of MacDermid Inc. that had a thickness of 75 μm was used as the metal nanoparticle bonding material in the manufacturing of the metal nanoparticle sintered body. The metal nanoparticle bonding material was arranged in a portion of the electrically conductive plate in which the semiconductor element was to be arranged. A type of metal contained in the metal nanoparticle bonding material is illustrated in Table 1. A silane coupling agent manufactured by Shin-Etsu Chemical Co., Ltd. and having the model number illustrated in Table 1 was used as the silane coupling agent and was diluted 10 times using ethanol. The diluted silane coupling agent with the same volume as the sintered body was dropped on the metal nanoparticle bonding material sheet and left to stand for 10 minutes. Next, the semiconductor element was placed on the silane coupling agent made to spread into the metal nanoparticle bonding material sheet and was bonded thereto by being heated and sintered under a pressure of 10 MPa at 250° C. for 5 minutes. The bonding layer was formed such that the thickness of the bonding layer after the sintering was 25 μm.

In Comparative Example 1, no silane coupling agent was used and the semiconductor element was placed on the metal nanoparticle bonding material sheet and sintered. In example 5, the metal nanoparticle bonding material sheet was impregnated with an epoxy resin to which a silane coupling agent KBM-803 was added, and the heating was performed in the same conditions as the other examples to perform the sintering. The composition of the epoxy resin was the same as the composition of the sealant to be described later.

The following materials were used as the sealant of the power semiconductor module. An epoxy resin ME-276 (manufactured by Pelnox, Ltd.) was used as the epoxy resin main agent and 121 parts by mass of MV-138 (manufactured by Pelnox, Ltd.) was added to 100 parts by mass of the main agent, as the acid anhydride curing agent. Spherical silica (manufactured by AGC Inc.) with an average particle size of 10 μm was used as the inorganic filler and 270 parts by mass of spherical silica was added to the epoxy resin main agent and the curing agent, in which the total mass of the epoxy resin main agent and the curing agent was 100 parts by mass. These materials were heated and cured at 100° C. for 1 hour, at 140° C. for 1 hour, and at 180° C. for 1 hour to manufacture the power semiconductor module.

(2) Heat Shock Test

A heat shock test was performed on each of the power semiconductor modules manufactured in the aforementioned section (1) to check the reliability. The heat shock test was performed as follows. The power semiconductor module was held in a chamber at −40° C. for 15 minutes, then put into a furnace to be rapidly heated to 125° C., held at 125° C. for 15 minutes, and put back into the chamber of −40° C. These operations were regarded as one cycle and reliability was determined by performing 2000 cycles of operations. Peeling was checked by using a scanning acoustic tomograph (SAT) and by observing a cross section with an optical microscope. A case in which there was no peeling or abnormality in electrical characteristics is denoted by "excellent" and a case in which there was peeling and abnormality in the electrical characteristics is denoted by "not good". A case in which there was no abnormality in the electrical characteristics, but fine peeling of 30 μm or smaller was observed, is denoted by "satisfactory".

The results are illustrated in Table 1.

TABLE 1

| | Example 1 | Example 2 | Example 3 | Example 4 | Example 5 | Comparative Example 1 |
|---|---|---|---|---|---|---|
| Coupling agent | Mercapto silane KBM-803 | Mercapto silane KBM-802 | Mercapto silane KBM-803 | Mercapto silane KBM-803 | Mercapto silane KBM-803 + epoxy | None |
| Metal | Ag | Ag | Au | Cu | Ag | Ag |
| Reliability | excellent | excellent | excellent | excellent | satisfactory (Fine crack) | not good |

From Table 1, in each of the semiconductor devices including the semiconductor element bonding portion in which the semiconductor element and the laminated substrate were bonded to each other by the bonding layer obtained by filling the nano Ag. Cu, or Au sintered body with the silane coupling agent including the mercapto group, no cracking or peeling occurred around (inside and around the sintered body) the semiconductor element when the heat shock was applied. Moreover, no oxidation of the Ag, Cu, or Au sintered body was observed. This is assumed to be due to the following reason. Since the silane coupling agent improved the bonding between the sealing resin and the metal and suppressed the oxidation of the nano metal sintered body, cracking in the sintered body was also reduced.

Although there is no intention to be bound to a theory, supplementary description is given of a reaction between the silane coupling agent including the mercapto group and used in the examples and each of the metal nanoparticle sintered body, the components forming the sealant, and the back electrode of the semiconductor element. The mercapto silane (KBM-803) reacts in the following way in the bonding layer during the sintering and between the bonding layer and the sealant during the heating and curing of the sealant. H in SH of the mercapto group is separated and forms thiol bonds with each of Ag, Cu, and Au. Moreover, an alkoxy group is hydrolyzed and becomes an OH group, and then the OH group undergoes dehydration condensation to form silanol bonds between two or more molecules derived from mercapto silane. Moreover, $—S^-$ portion of the mercapto group from which H is separated has a negative charge and reacts with an epoxy group of the epoxy resin to form a cross-link structure. These reactions form covalent bonds among the thermosetting resins that are main components of the metal nanoparticle sintered body, the coupling agent, and the sealant and contribute to adhesiveness between the bonding layer and the sealant. When the sealant contains an inorganic filler such as silica and alumina, dehydration condensation occurs between an OH group present on surfaces of these metal oxides and a molecule that has become an OH group by the hydrolyzation of the alkoxy group and that is derived from the mercapto silane, and covalent bonds are also formed between the coupling agent and the inorganic filler. Note that the aforementioned reaction does not necessary occur among all molecules. Accordingly, it can be said that the thermosetting resin forming the sealant preferably includes the aforementioned epoxy group or a functional group such as an amino group, a vinyl group, a methacrylic group, or a mercapto group that reacts and bonds to the mercapto group of the coupling agent.

Moreover, the following reaction is assumed to occur between the metal nanoparticles and each of the back electrode of the semiconductor element such as Au and Ag and the electrically conductive plate (Cu, Al, or the like) of the laminated substrate. As described above, the metal nanoparticles form thiol bonds with the mercapto group of the coupling agent, and a hydroxyl group is formed at one end of the coupling agent. It is assumed that, since hydroxyl groups are generated also on the surfaces of the back electrode of the semiconductor element such as Au and Ag and the electrically conductive plate (Cu, Al, or the like) of the laminated substrate, dehydration condensation occurs between these hydroxyl groups and the hydroxyl group of the coupling agent and covalent bonds are formed also between the coupling agent and each of the back electrode and the electrically conductive plate of the laminated substrate.

REFERENCE SIGNS LIST

10 bonding layer
101 metal nanoparticle sintered body
102 coupling agent
11 semiconductor element
111 back electrode
12 laminated substrate
121 electrically conductive plate
122 insulation substrate
123*a*, 123*b* electrically conductive plate
13 heat dissipation plate
14 aluminum wire
15 external terminal
16 case
17 solder bonding layer
18 lead frame
20 sealant

What is claimed is:

1. A semiconductor element bonding portion comprising:
a semiconductor element;
a laminated substrate; and
a bonding layer that bonds the semiconductor element and the laminated substrate to each other, wherein
the bonding layer includes a sintered body of metal nanoparticles and a silane coupling agent including an SH group,
the sintered body of the metal nanoparticles is a porous metal body in which the metal nanoparticles are sintered and bonded to one another to be continuous, and
a periphery of the sintered body of the metal nanoparticles is coated with the silane coupling agent in the bonding layer.

2. The semiconductor element bonding portion according to claim 1, wherein the metal nanoparticle is one or more particles selected from a group consisting of a silver nanoparticle, a copper nanoparticle, and a gold nanoparticle.

3. The semiconductor element bonding portion according to claim 1, wherein the semiconductor element includes a gold electrode on a contact surface with the bonding layer.

4. A semiconductor device comprising:
sealed members including an electrically conductive connection member and a semiconductor element mounted on a laminated substrate;
a sealant that seals the sealed members; and
the semiconductor element bonding portion according to claim 1.

5. The semiconductor device according to claim 4, wherein the sealant contains a thermosetting resin curing agent.

6. The semiconductor device according to claim 5, further comprising a primer layer at an interface between the sealant and each of the sealed members including the bonding layer, the semiconductor element, and the electrically conductive connection member.

7. The semiconductor device according to claim 5, wherein the semiconductor element is an Si or wide-bandgap semiconductor element.

8. The semiconductor device according to claim 4, further comprising a primer layer at an interface between the sealant and each of the sealed members including the bonding layer, the semiconductor element, and the electrically conductive connection member.

9. The semiconductor device according to claim 4, wherein the semiconductor element is an Si or wide-bandgap semiconductor element.

10. The semiconductor element bonding portion according to claim 1, wherein, the silane coupling agent is a compound expressed by $SH\text{-}A\text{-}Si(OR^1)_n(R^2)_{3-n}$, wherein
A is a linear or branched, saturated or unsaturated hydrocarbon group;
$R^1$ and $R^2$ are independent from each other and are each a linear or branched hydrocarbon group with a carbon number of 1 to 3; and
n is an integer selected from 1 to 3.

11. The semiconductor element bonding portion according to claim 1, wherein, the bonding layer has a thickness of 10 μm to 300 μm.

12. The semiconductor element bonding portion according to claim 1, wherein, the bonding layer contains no thermosetting resin.

13. The semiconductor element bonding portion according to claim 1, wherein, in the bonding layer, a mixing ratio of the sintered body and the silane coupling agent diluted 10 times is about 1:0.7 to 1:1.3 in volume ratio.

14. The semiconductor element bonding portion according to claim 1, wherein, in the bonding layer, the sintered body of the metal nanoparticle is a porous metal body in which metal nanoparticles with an average particle size of about 1 to 200 nm are sintered at 200 to 350° C. and bonded to one another to be continuous.

15. The semiconductor element bonding portion according to claim 1, wherein the metal nanoparticle is one or more particles selected from a group consisting of a silver nanoparticle, a copper nanoparticle, and a gold nanoparticle.

16. The semiconductor element bonding portion according to claim 1, wherein the semiconductor element includes a gold electrode on a contact surface with the bonding layer.

* * * * *